US012621017B2

(12) United States Patent　　　　(10) Patent No.:　US 12,621,017 B2

Mori et al.　　　　　　　　　　　　　(45) Date of Patent:　　May 5, 2026

(54) RADIO FREQUENCY CIRCUIT AND COMMUNICATION DEVICE

(71) Applicant: Murata Manufacturing Co., Ltd., Nagaokakyo (JP)

(72) Inventors: Hirotsugu Mori, Nagaokakyo (JP); Shinya Hitomi, Nagaokakyo (JP); Satoshi Tanaka, Nagaokakyo (JP); Masahide Takebe, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 318 days.

(21) Appl. No.: 18/587,977

(22) Filed: Feb. 27, 2024

(65) Prior Publication Data

US 2024/0275424 A1　　Aug. 15, 2024

Related U.S. Application Data

(63) Continuation of application No. PCT/JP2022/028391, filed on Jul. 21, 2022.

(30) Foreign Application Priority Data

Sep. 2, 2021　(JP) ................................ 2021-143388

(51) Int. Cl.
*H04L 12/00*　　　(2006.01)
*H03F 3/24*　　　(2006.01)
(Continued)

(52) U.S. Cl.
CPC ............. *H04B 1/401* (2013.01); *H03F 3/245* (2013.01); *H03F 2200/294* (2013.01); *H03F 2200/451* (2013.01); *H04L 5/14* (2013.01)

(58) Field of Classification Search
CPC .......... H04B 1/401; H04B 1/006; H04B 1/00; H04F 3/245; H04F 3/72; H03F 2200/294; H03F 2200/451; H04L 5/14
(Continued)

(56) References Cited

U.S. PATENT DOCUMENTS 9,621,327 B2 *　4/2017　Chang ................... H04L 5/1469
11,936,408 B2 *　3/2024　Zhou ......................... H03F 3/19
(Continued)

FOREIGN PATENT DOCUMENTS

JP　　2005-260703 A　　9/2005
JP　　2006-311300 A　　11/2006
(Continued)

OTHER PUBLICATIONS

International Search Report and Written Opinion mailed on Oct. 25, 2022, received for PCT Application PCT/JP2022/028391, filed on Jul. 21, 2022, 08 pages including English Translation.

*Primary Examiner* — Frantz Coby
(74) *Attorney, Agent, or Firm* — XSENSUS LLP

(57)　　　　　　　　ABSTRACT

A radio frequency circuit includes a power amplifier, which supports Power class 2, a first filter, which is connected to the power amplifier, which supports Power class 3, and which has a passband including the uplink operating band of Band A for FDD, a second filter, which is connected to the power amplifier, which supports Power class 3, and which has a passband including the uplink operating band of Band A, and a third filter, which is connected to the power amplifier, which supports Power class 2, and which has a passband including Band B for TDD. Assuming a transmit signal in Band A, which supports Power class 2, from the power amplifier is to be output, a transmit signal in Band A is split for output to the first filter and the second filter. Assuming a transmit signal in Band B, which supports (Continued)

Power class 2, is to be output, a transmit signal in Band B
is output from the power amplifier to the third filter.

11 Claims, 10 Drawing Sheets

(51) Int. Cl.
   *H04B 1/401*          (2015.01)
   *H04L 5/14*           (2006.01)
(58) Field of Classification Search
   USPC ........................................................ 370/280
   See application file for complete search history.

(56)                    References Cited

U.S. PATENT DOCUMENTS

2015/0133067  A1      5/2015  Chang et al.
2020/0321673  A1 *  10/2020  Sun ......................... H04L 25/03
2022/0255574  A1 *   8/2022  Harrison .............. H04B 1/0483

FOREIGN PATENT DOCUMENTS

JP        2011-030069  A     2/2011
JP        2021-072583  A     5/2021
JP        2021-145290  A     9/2021

* cited by examiner

FIG. 5C

RADIO FREQUENCY CIRCUIT AND COMMUNICATION DEVICE

CROSS REFERENCE TO RELATED APPLICATION

This is a continuation application of PCT International Application No. PCT/JP2022/028391 filed on Jul. 21, 2022, designating the United States of America, which is based on and claims priority of Japanese Patent Application No. 2021-143388 filed on Sep. 2, 2021. The entire disclosures of the above-identified applications, including the specifications, drawings and claims are incorporated herein by reference in their entirety.

TECHNICAL FIELD

The present disclosure relates to a radio frequency circuit and a communication device.

BACKGROUND

In 3GPP (registered trademark) (3rd Generation Partnership Project), application of a power class (for example, Power class 2 or the like), which allows maximum output power (electric power) higher than a conventional one, to bands for frequency division duplex (FDD: Frequency Division Duplex) has been discussed.

CITATION LIST

Patent Literature

PTL 1: U.S. Unexamined Patent Application Publication No. 2015/0133067

SUMMARY

Technical Problems

However, assuming a power class, which allows maximum output power higher than a conventional one, is applied to a band for FDD, a filter, which is supplied with signals continuously, not discontinuously, enters the high temperature state, and the electric power handling performance enters the critical state. Thus, the transmission characteristics of a radio frequency circuit including the filter may degrade.

Accordingly, the present disclosure provides a radio frequency circuit and a communication device in which degradation of the transmission characteristics is suppressed assuming a power class, which allows maximum output power higher than a conventional one, is applied to a band for FDD.

Solutions

To attain the object, a radio frequency circuit according to an aspect of the present disclosure includes an antenna connection terminal; a power amplifier circuit that supports Power class 2; a first filter that is connected between the power amplifier circuit and the antenna connection terminal, that supports Power class 3, and that has a passband including an uplink operating band of a first band for frequency division duplex; a second filter that is connected between the power amplifier circuit and the antenna connection terminal, that supports Power class 3, and that has a passband including the uplink operating band of the first band for frequency division duplex; and a third filter that is connected between the power amplifier circuit and the antenna connection terminal, that supports Power class 2, and that has a passband including a second band for time division duplex. Assuming a transmit signal in the first band, which supports Power class 2, is to be output from the antenna connection terminal, a transmit signal in the first band from the power amplifier circuit is split for output to the first filter and the second filter. Assuming a transmit signal in the second band, which supports Power class 2, is to be output from the antenna connection terminal, a transmit signal in the second band is output from the power amplifier circuit to the third filter.

In addition, a radio frequency circuit according to an aspect of the present disclosure includes a first substrate; a first antenna connection terminal and a second antenna connection terminal; a first amplifier that supports Power class 2; a first filter that is connected between the first amplifier and the first antenna connection terminal, that supports Power class 3, and that has a passband including an uplink operating band of a first band for frequency division duplex; a third filter that is connected between the first amplifier and the first antenna connection terminal, that supports Power class 2, and that has a passband including a second band for time division duplex; a first switch that has a first common terminal, a first selection terminal, and a second selection terminal, and that switches between connection between the first common terminal and the first selection terminal and connection between the first common terminal and the second selection terminal; and a third switch that has a third common terminal, a fourth common terminal, a fifth selection terminal, a sixth selection terminal, and a seventh selection terminal, that switches between connection and non-connection between the fourth common terminal and the sixth selection terminal, and that switches between connection between the third common terminal and the fifth selection terminal and connection between the third common terminal and the seventh selection terminal. An output terminal of the first amplifier is connected to the first common terminal. The first selection terminal is connected to an input end of the first filter, and the second selection terminal is connected to an input end of the third filter. The third common terminal is connected to the first antenna connection terminal, the fourth common terminal is connected to the second antenna connection terminal, the fifth selection terminal is connected to an output end of the first filter, and the seventh selection terminal is connected to an output end of the third filter. The first amplifier, the first switch, the third switch, the first filter, and the third filter are disposed on/in the first substrate. In the case of output of a transmit signal in the first band, which supports Power class 2, assuming a transmit signal in the uplink operating band of the first band, which supports Power class 3, is being input at the sixth selection terminal from a second amplifier different from the first amplifier, a transmit signal in the uplink operating band of the first band, which supports Power class 3, is output from the first amplifier to the first filter. In the case of output of a transmit signal in the second band, which supports Power class 2, a transmit signal in the second band is output from the first amplifier to the third filter.

Advantageous Effects

The present disclosure enables provision of a radio frequency circuit and a communication device, in which degradation of the transmission characteristics is suppressed assuming a power class, which allows maximum output power higher than a conventional one, is applied to a band for FDD.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 5C is a circuit configuration diagram of a radio frequency circuit according to a fifth modified example of an embodiment.

DESCRIPTION OF EMBODIMENTS

Figure 1:
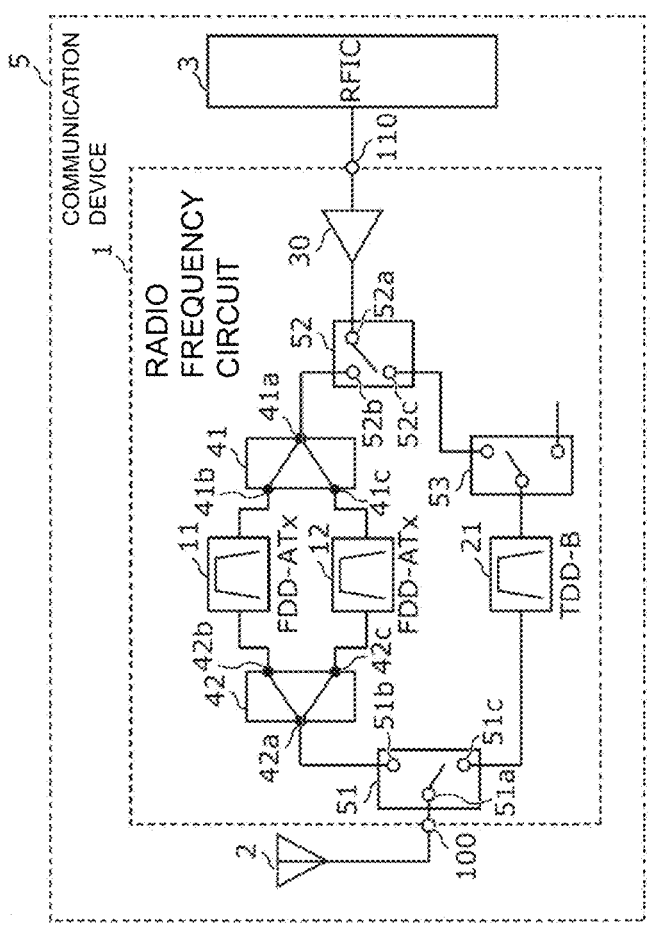
FIG. 1 is a circuit configuration diagram of a radio frequency circuit and a communication device according to an embodiment.

Embodiments of the present disclosure will be described below in detail. The embodiments described below each indicate a comprehensive or specific example. Values, shapes, materials, components, the arrangement and the connection forms of components, and the like, which are described in the embodiments below, are exemplary, and are not intended to limit the present disclosure. Among components in an embodiment example and modified examples below, components that are not described in independent claims are described as optional components. The sizes or the ratios in size of the components illustrated in the drawings are not necessarily strict. In the figures, substantially the same configurations are designated with identical reference numerals. Repeated description may be avoided or simplified.

Hereinafter, terms indicating the relationship between components, such as parallel and perpendicular, terms indicating the shapes of components, such as rectangular, and numerical ranges do not represent only strict meaning, and mean substantially equivalent ranges, for example, having errors in the order of a few percent.

In the circuit configuration of the present disclosure, "to be connected" encompasses, not only the case of direct connection using connection terminals and/or wiring conductors, but also the case of electrical connection via other circuit devices. "To be connected between A and B" means connection to both A and B between A and B, and encompasses, in addition to direct connection to a path connecting A to B, parallel connection (shunt connection) between the path and the ground.

In a component layout in the present disclosure, "to dispose a component on/in a substrate" encompasses placement of the component on a principal surface of the substrate and placement of the component in the substrate. "To dispose a component on a principal surface of a substrate" encompasses, in addition to placement of the component which is in contact with the principal surface of the substrate, placement of the component above the principal surface without contact with the principal surface (for example, stacking the component on a different component which is disposed so as to be in contact with the principal surface). "To dispose a component on a principal surface of a substrate" may encompass placement of the component in a recess formed on the principal surface. "To dispose a component in a substrate" encompasses, in addition to the component encapsulated in the module substrate, the component, all of which is disposed between the principal surfaces of the substrate but a part of which is not covered by the substrate, and the component, only a part of which is disposed in the substrate.

In the present disclosure, a "signal path" means a transmission line constituted, for example, by wiring through which radio frequency signals are propagated, electrodes which are directly connected to the wiring, and terminals connected directly to the wiring or the electrodes.

Embodiment

[1 The Circuit Configuration of a Radio Frequency Circuit 1 and a Communication Device 5]

The circuit configuration of a radio frequency circuit 1 and a communication device 5 including it according to the present embodiment will be described by referring to FIG. 1. FIG. 1 is a circuit configuration diagram of the radio frequency circuit 1 and the communication device 5 according to the present embodiment.

[1.1 The Circuit Configuration of the Communication Device 5]

The communication device 5 corresponds to a so-called user equipment (UE: User Equipment), and is typically a cellular phone, a smartphone, a tablet computer, or the like. The communication device 5 as described above includes the radio frequency circuit 1, an antenna 2, and an RFIC (Radio Frequency Integrated Circuit) 3.

The radio frequency circuit 1 transmits radio frequency signals between the antenna 2 and the RFIC 3. The internal configuration of the radio frequency circuit 1 will be described below.

The antenna 2 is connected to an antenna connection terminal 100 of the radio frequency circuit 1. The antenna 2 receives radio frequency signals from the radio frequency circuit 1 for output to the outside.

The RFIC 3 is an exemplary signal processing circuit which processes radio frequency signals. Specifically, the RFIC 3 performs signal processing such as up-conversion on transmit signals input from a BBIC (Baseband Integrated Circuit: not illustrated), and outputs, to transmit paths of the radio frequency circuit 1, radio-frequency transmit signals generated through the signal processing. In addition, the RFIC 3 has a controller which controls the switch circuits, the amplifier circuits, and the like which are included in the radio frequency circuit 1. Some or all of the functions of the RFIC 3 as a controller may be provided outside the RFIC 3, and, for example, may be included in the BBIC or the radio frequency circuit 1.

In the communication device 5 according to the present embodiment, the antenna 2 is not a necessary component.

[1.2 The Circuit Configuration of the Radio Frequency Circuit 1]

Next, the circuit configuration of the radio frequency circuit 1 will be described. As illustrated in FIG. 1, the radio frequency circuit 1 includes filters 11, 12 and 21, a power amplifier 30, a splitter circuit 41, a combiner circuit 42, switches 51, 52 and 53, the antenna connection terminal 100, and a radio-frequency input terminal 110.

The antenna connection terminal 100 is connected to the antenna 2. The radio-frequency input terminal 110 is a terminal for receiving radio-frequency transmit signals (hereinafter denoted as transmit signals) from the outside of the radio frequency circuit 1 (RFIC 3).

The filter 11, which is an exemplary second filter, supports Power class 3, and has a passband including the uplink operating band of Band A for FDD. The filter 11 is connected to the power amplifier 30 through the switch 52 and the splitter circuit 41.

The filter 12, which is an exemplary first filter, supports Power class 3, and has a passband including the uplink operating band of Band A for FDD. The filter 12 is connected to the power amplifier 30 through the switch 52 and the splitter circuit 41.

The filter 21, which is an exemplary third filter, supports Power class 2, and has a passband including Band B for time division duplex (TDD: Time Division Duplex). The filter 21 is connected to the power amplifier 30 through the switches 52 and 53.

The power amplifier 30, which is an exemplary power amplifier circuit, supports Power class 2. The power amplifier 30 is capable of amplifying transmit signals in Band A and Band B which are input from the radio-frequency input terminal 110. The power amplifier 30 is connected between the radio-frequency input terminal 110 and the switch 52.

Band A, which is an exemplary first band, is a frequency band for communication systems constructed by using radio access technology (RAT: Radio Access Technology) predefined by a standardization organization and the like (for example, 3GPP, IEEE (Institute of Electrical and Electronics Engineers), and the like). As communication systems, for example, 5GNR (5th Generation New Radio) systems, LTE (Long Term Evolution) systems, WLAN (Wireless Local Area Network) systems, and the like, but not limited to these, may be used.

Band A is constituted by a downlink operating band and an uplink operating band. In Band B, an uplink operating band matches a downlink operating band. The entire frequency range of Band B is the uplink operating band, and is also the downlink operating band.

An uplink operating band means a frequency range designated for the uplink in the band. A downlink operating band means a frequency range designated for the downlink in the band.

Power class indicates classification of output power of UEs which is defined by using the maximum output power or the like. A smaller value of a power class indicates allowance of output of higher power. For example, in 3GPP, the maximum output power allowed in Power class 1 is 31 dBm; the maximum output power allowed in Power class 1.5 is 29 dBm; the maximum output power allowed in Power class 2 is 26 dBm; the maximum output power allowed in Power class 3 is 23 dBm.

The maximum output power of a UE is defined by using output power at the antenna end of the UE. The maximum output power of a UE is measured, for example, by using a method defined by 3GPP or the like. For example, in FIG. 1, the maximum output power is measured by measuring the radiant power of the antenna 2. Instead of measurement of radiant power, a terminal is disposed near the antenna 2, and a measuring instrument (for example, a spectrum analyzer or the like) is connected to the terminal. Thus, the output power of the antenna 2 may be measured.

In the radio frequency circuit 1 according to the present embodiment, Band A is, for example, Band B1 for FDD LTE or Band n1 (the uplink operating band: 1920-1980 MHz, the downlink operating band: 2110-2170 MHz) for 5GNR; Band B is, for example, Band B34 for TDD LTE or Band n34 (2010-2025 MHz) for 5GNR.

The splitter circuit 41, which has a terminal 41a (first terminal), a terminal 41b (third terminal), and a terminal 41c (second terminal), splits the power of a signal which is input at the terminal 41a, and outputs, from the terminal 41b and the terminal 41c, radio frequency signals obtained through the power splitting.

The combiner circuit 42, which has a terminal 42a (sixth terminal), a terminal 42b (fifth terminal), and a terminal 42c (fourth terminal), combines the power of the signals input at the terminal 42b and the terminal 42c, and outputs, from the terminal 42a, a radio frequency signal obtained through the power combining.

The switch 51, which is an exemplary second switch, is connected between the antenna connection terminal 100, and the combiner circuit 42 and the filter 21. Specifically, the switch 51 has a common terminal 51a (second common terminal) and selection terminals 51b (third selection terminal) and 51c (fourth selection terminal). The common terminal 51a is connected to the antenna connection terminal 100; the selection terminal 51b is connected to the terminal 42a; the selection terminal 51c is connected to the output end of the filter 21. Through this connection configuration, the switch 51 switches between connection between the antenna connection terminal 100 and the filters 11 and 12 and connection between the antenna connection terminal 100 and the filter 21, for example, on the basis of a control signal from the RFIC 3.

The switch 52, which is an exemplary first switch, is connected between the power amplifier 30, and the splitter circuit 41 and the switch 53. Specifically, the switch 52 has a common terminal 52a (first common terminal) and selection terminals 52b (first selection terminal) and 52c (second selection terminal). The common terminal 52a is connected to the output terminal of the power amplifier 30; the selection terminal 52b is connected to the terminal 41a; the selection terminal 52c is connected to the filter 21 through the switch 53. Through this connection configuration, the switch 52 switches between connection between the power amplifier 30 and the filters 11 and 12 and connection between the power amplifier 30 and the filter 21, for example, on the basis of a control signal from the RFIC 3.

The switch 53, which is a an exemplary so-called TDD switch, switches between connection between the input end of the filter 21 and the power amplifier 30 and connection between the input end of the filter 21 and a low-noise amplifier (not illustrated).

At least one of the switches 51 to 53 may be formed by a semiconductor IC (Integrated Circuit). A semiconductor IC is constituted, for example, by CMOS (Complementary Metal Oxide Semiconductor). Specifically, the semiconductor IC is formed by using an SOI (Silicon On Insulator) process. This enables a semiconductor IC to be manufactured at low cost. The semiconductor IC may be formed of at least any of GaAs, SiGe, and GaN. This enables output of radio frequency signals having high-quality amplification performance and noise performance.

Some of the circuit devices illustrated in FIG. 1 are not necessarily included in the radio frequency circuit 1. For example, the radio frequency circuit 1 may include at least the power amplifier 30 and the filters 11, 12 and 21, not necessarily the other circuit devices.

[1.3 The Transmission State of FDD Signals and TDD Signals in the Radio Frequency Circuit 1]

Next, the states in which the radio frequency circuit 1 according to the embodiment transmits FDD signals and TDD signals will be described.

Figure 2A:
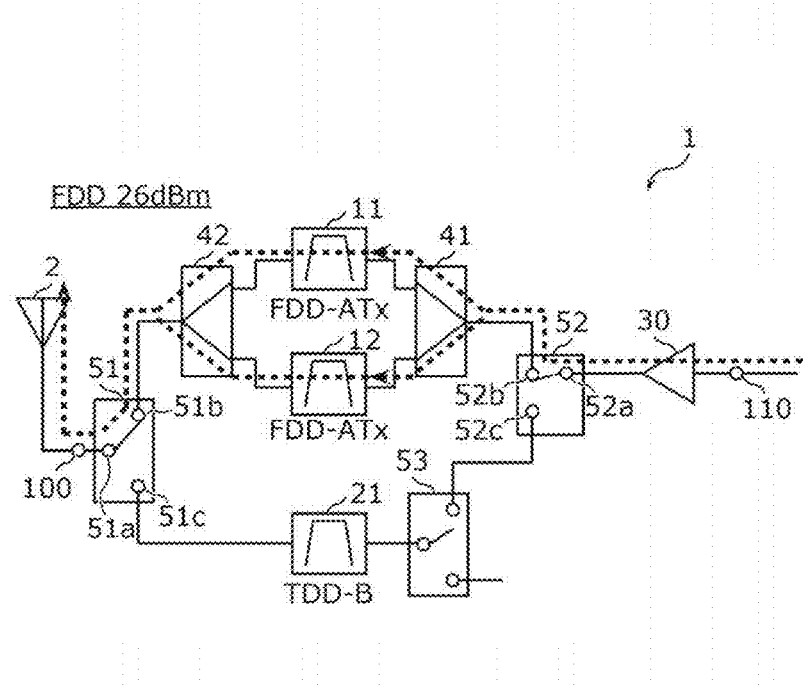
FIG. 2A is a diagram illustrating the transmission state of a Power-class-2 FDD signal in a radio frequency circuit according to an embodiment.

FIG. 2A is a diagram illustrating the transmission state of a Power-class-2 FDD signal in Band A, in the radio frequency circuit 1 according to the embodiment. Assuming a Power-class-2 FDD signal in Band A (for example, 26 dBm) is to be transmitted, the common terminal 52*a* and the selection terminal 52*b* enter the connection state; the common terminal 51*a* and the selection terminal 51*b* enter the connection state.

At that time, as illustrated in the figure, a transmit signal in Band A is transmitted through the transmit path of the radio-frequency input terminal 110, the power amplifier 30, the switch 52, the splitter circuit 41, the filters 11 and 12, the combiner circuit 42, the switch 51, the antenna connection terminal 100, and the antenna 2. That is, assuming a transmit signal in Band A, which supports Power class 2, is to be output from the antenna connection terminal 100, the power of the transmit signal in Band A from the power amplifier 30 is split for output to the filters 11 and 12.

Figure 2B:
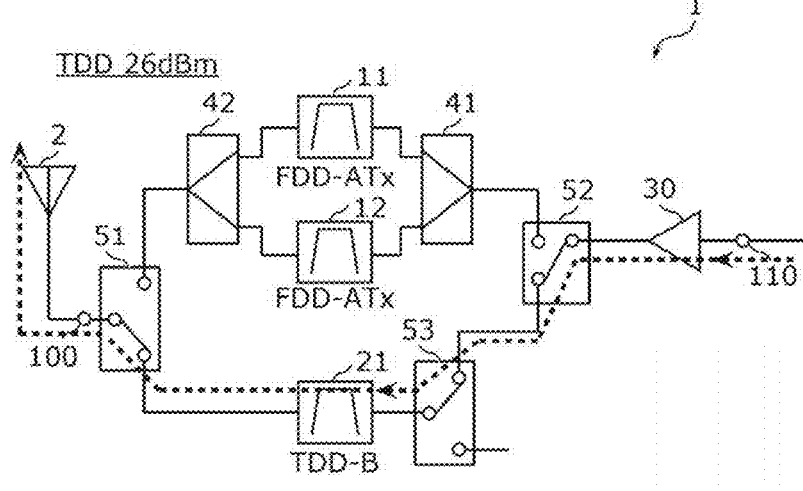
FIG. 2B is a diagram illustrating the transmission state of a Power-class-2 TDD signal in a radio frequency circuit according to an embodiment.

FIG. 2B is a diagram illustrating the transmission state of a Power-class-2 TDD signal in Band B, in the radio frequency circuit 1 according to the embodiment. Assuming a Power-class-2 TDD signal in Band B (for example, 26 dBm) is to be transmitted, the common terminal 52*a* and the selection terminal 52*c* enter the connection state; the common terminal 51*a* and the selection terminal 51*c* enter the connection state.

At that time, as illustrated in the figure, a transmit signal in Band B is transmitted through the transmit path of the radio-frequency input terminal 110, the power amplifier 30, the switch 52, the switch 53, the filter 21, the switch 51, the antenna connection terminal 100, and the antenna 2. That is, assuming a transmit signal in Band B, which supports Power class 2, is to be output from the antenna connection terminal 100, the transmit signal in Band B from the power amplifier 30 is output to the filter 21.

This enables a Power-class-2 transmit signal for TDD to be transmitted through the filter 21. In contrast of a Powerclass-2 transmit signal for TDD, a Power-class-2 transmit signal for FDD, which is transmitted continuously, not in a time division manner, has a high power density. Therefore, assuming the filter 11 or 12 singly transmits a Power-class-2 transmit signal for FDD, the filter enters the high-temperature state, and the electric power handling capability enters the critical state. Therefore, the bandpass characteristics of the filter 11 or 12 may degrade. In contrast, as illustrated in FIG. 2A, each of the filters 11 and 12, which has difficulty in transmission of a Power-class-2 transmit signal for FDD with use of only the single filter, transmits a Power-class-3 transmit signal (for example, 23 dBm). This enables a Power-class-2 transmit signal for FDD to be transmitted without degradation of the filter bandpass characteristics.

[1.4 Exemplary Circuit Configurations of the Splitter Circuit 41 and the Combiner Circuit 42]

Next, exemplary circuit configurations of the splitter circuit 41 and the combiner circuit 42 which are included in the radio frequency circuit 1 according to the embodiment will be described.

Figure 3A:
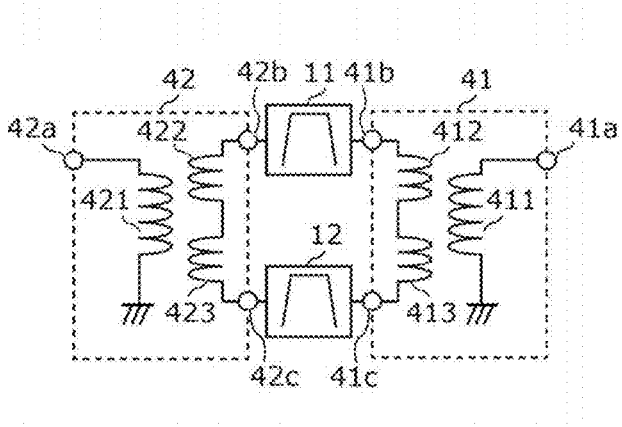
FIG. 3A is a diagram illustrating a first example of a splitter circuit and a combiner circuit according to an embodiment.

FIG. 3A is a diagram illustrating a first example of the splitter circuit 41 and the combiner circuit 42 according to the embodiment. As illustrated in the figure, the splitter circuit 41 of the example has inductors 411, 412, and 413. An end of the inductor 411 is connected to the terminal 41*a*; the other end is connected to the ground. An end of the inductor 412 is connected to the terminal 41*b*; the other end is connected to an end of the inductor 413. The other end of the inductor 413 is connected to the terminal 41*c*. That is, the splitter circuit 41 of the example is a transformer having the inductor 411 as an input-side coil and the inductors 412 and 413 as output-side coils.

As illustrated in FIG. 3A, the combiner circuit 42 of the example has inductors 421, 422, and 423. An end of the inductor 421 is connected to the terminal 42*a*; the other end is connected to the ground. An end of the inductor 422 is connected to the terminal 42*b*; the other end is connected to an end of the inductor 423. The other end of the inductor 423 is connected to the terminal 42*c*. That is, the combiner circuit 42 of the example is a transformer having the inductor 421 as an output-side coil and the inductors 422 and 423 as input-side coils.

Figure 3B:
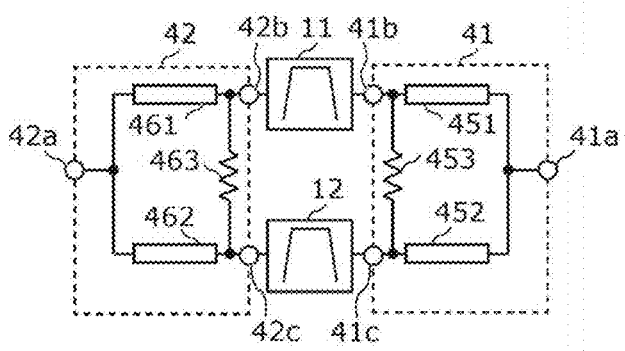
FIG. 3B is a diagram illustrating a second example of a splitter circuit and a combiner circuit according to an embodiment.

FIG. 3B is a diagram illustrating a second example of the splitter circuit 41 and the combiner circuit 42 according to the embodiment. As illustrated in the figure, the splitter circuit 41 of the example has quarter-wave transmission lines 451 and 452 and a resistance device 453. An end of the quarter-wave transmission line 451 and an end of the quarter-wave transmission line 452 are connected to the terminal 41*a*; the other end of the quarter-wave transmission line 451 is connected to an end of the resistance device 453 and the terminal 41*b*; the other end of the quarter-wave transmission line 452 is connected to the other end of the resistance device 453 and the terminal 41*c*. That is, the splitter circuit 41 of the example is a Wilkinson splitter.

As illustrated in FIG. 3B, the combiner circuit 42 of the example has quarter-wave transmission lines 461 and 462 and a resistance device 463. An end of the quarter-wave transmission line 461 and an end of the quarter-wave transmission line 462 are connected to the terminal 42*a*; the other end of the quarter-wave transmission line 461 is connected to an end of the resistance device 463 and the terminal 42*b*; the other end of the quarter-wave transmission line 462 is connected to the other end of the resistance device 463 and the terminal 42*c*. That is, the combiner circuit 42 of the example is a Wilkinson splitter.

Figure 3C:
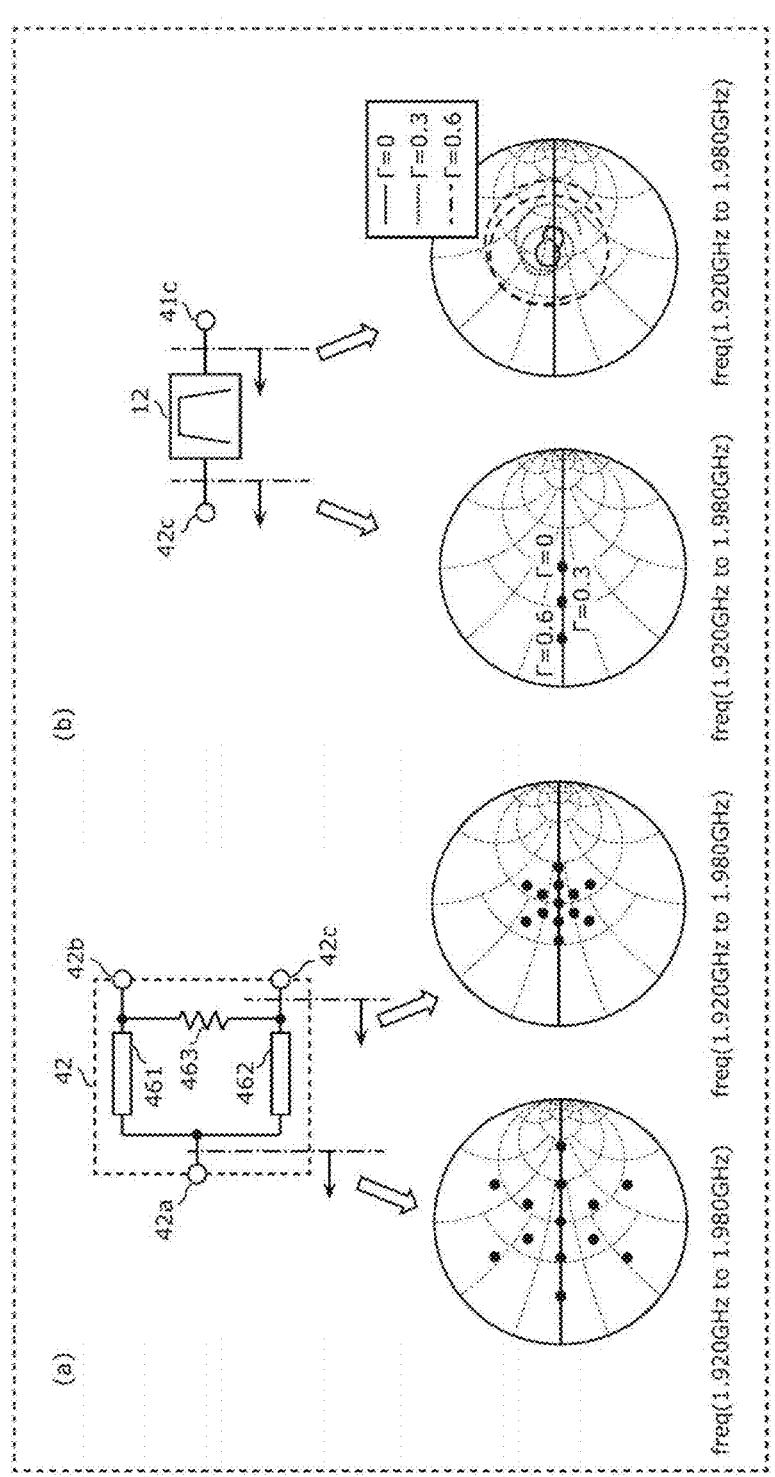
FIG. 3C is a diagram for describing changes of impedance of a filter with respect to changes of load in the second example.

FIG. 3C is a diagram for describing changes of impedance of a filter with respect to changes of load in the second example. In (a) in the figure, impedance (reflection coefficients), as seen from the terminals of the combiner circuit 42 to the antenna connection terminal 100 side (load), is illustrated. In (b) in the figure, impedance, as seen from the input end of the filter 12 to the filter 12, with respect to impedance (reflection coefficient), as seen from the output end of the filter 12 to the antenna connection terminal 100 side (load), is illustrated.

As illustrated in (a) in FIG. 3C, compared with the impedance as seen from the terminal 42a to the load, impedance, as seen from each of the terminals 42b and 42c to the load, is close to the reference impedance (for example, 50Ω). More specifically, the reflection coefficients Γ at each of the terminals 42b and 42c are half of the reflection coefficients Γ at the terminal 42a.

As illustrated in (b) in FIG. 3C, as the reflection coefficient Γ at the terminal 42c becomes smaller from 0.6 to 0.3 to 0, the winding (change width) of the impedance of the filter 12, as seen from the terminal 41c, becomes smaller, and converges to the reference impedance.

That is, Wilkinson splitters are applied to the splitter circuit 41 and the combiner circuit 42, and the filters 11 and 12 are connected in parallel between the splitter circuit 41 and the combiner circuit 42. Thus, deviation of the impedance of the filters 11 and 12 from the reference impedance with respect to a change of load (change of the reflection coefficient Γ) may be suppressed. This enables suppression of a change of output impedance of the power amplifier 30 with respect to a change of load.

Figure 3D:
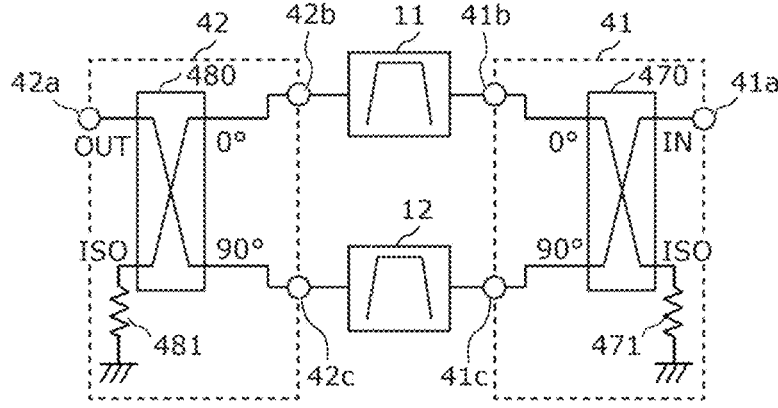
FIG. 3D is a diagram illustrating a third example of a splitter circuit and a combiner circuit according to an embodiment.

FIG. 3D is a diagram illustrating a third example of the splitter circuit 41 and the combiner circuit 42 according to the embodiment. As illustrated in the figure, the splitter circuit 41 of the example has a 90° hybrid coupler 470 and a terminator 471. The 0° terminal of the 90° hybrid coupler 470 is connected to the terminal 41b; the 90° terminal is connected to the terminal 41c; the IN terminal is connected to the terminal 41a; the ISO terminal is connected to the terminator 471. The power of a transmit signal which is input from the IN terminal is split to the 0° terminal and the 90° terminal, for output from the terminals 41b and 41c.

The combiner circuit 42 of the example has a 90° hybrid coupler 480 and a terminator 481. The 0° terminal of the 90° hybrid coupler 480 is connected to the terminal 42b; the 90° terminal is connected to the terminal 42c; the OUT terminal is connected to the terminal 42a; the ISO terminal is connected to the terminator 481. The transmit signals obtained through the power splitting at the splitter circuit 41 pass through the respective filters 11 and 12 for input to the 0° terminal and the 90° terminal. The power of the signals input at the 0° terminal and the 90° terminal is combined for output through the OUT terminal from the terminal 42a.

[1.5 The Circuit Configuration of a Radio Frequency Circuit 1A according to a First Modified Example]

Next, the circuit configuration of a radio frequency circuit 1A according to a first modified example will be described by referring to FIG. 4A.

Figure 4A:
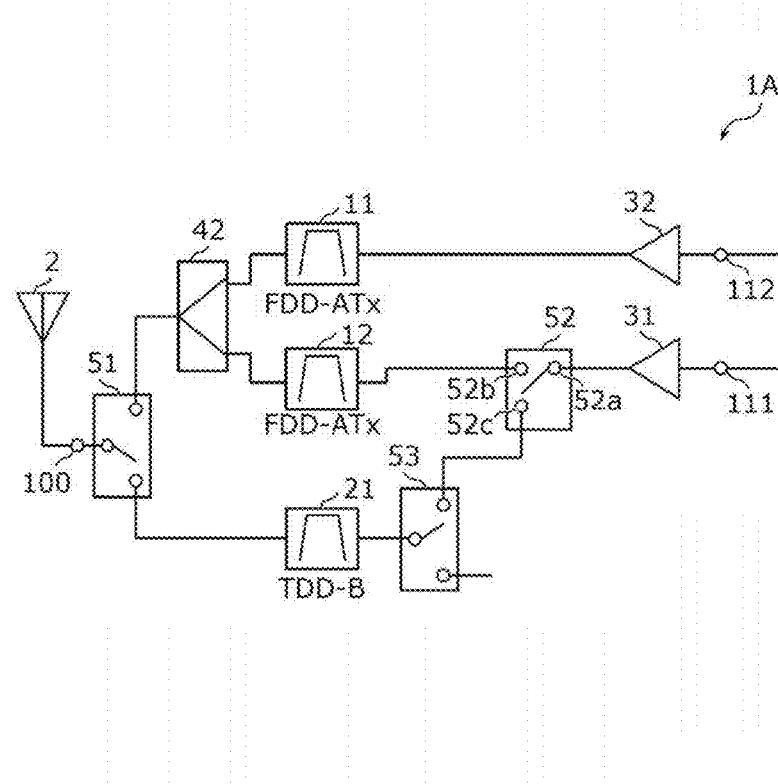
FIG. 4A is a circuit configuration diagram of a radio frequency circuit according to a first modified example of an embodiment.

FIG. 4A is a circuit configuration diagram of the radio frequency circuit 1A according to the first modified example of the embodiment. As illustrated in the figure, the radio frequency circuit 1A includes the filters 11, 12 and 21, power amplifiers 31 and 32, the combiner circuit 42, the switches 51, 52 and 53, the antenna connection terminal 100, and radio-frequency input terminals 111 and 112. The radio frequency circuit 1A according to the present modified example is different from the radio frequency circuit 1 according to the embodiment in the configuration of the power amplifier circuit and in that the splitter circuit 41 is excluded. Description about points of the radio frequency circuit 1A according to the present modified example, which are identical to those of the radio frequency circuit 1 according to the embodiment, will be skipped below, and different points will be described mainly.

Each of the radio-frequency input terminals 111 and 112 is a terminal for receiving transmit signals from the outside of the radio frequency circuit 1A (RFIC 3).

The filter 11, which is an exemplary second filter, supports Power class 3, and has a passband including the uplink operating band of Band A for FDD. The filter 11 is connected to the power amplifier 32.

The filter 12, which is an exemplary first filter, supports Power class 3, and has a passband including the uplink operating band of Band A for FDD. The filter 12 is connected to the power amplifier 31 through the switch 52.

The power amplifier 31, which is an exemplary first amplifier included in the power amplifier circuit, supports Power class 2. The power amplifier 31 is capable of amplifying transmit signals in Band A and Band B which are input from the radio-frequency input terminal 111. The power amplifier 31 is connected between the radio-frequency input terminal 111 and the switch 52.

The power amplifier 32, which is an exemplary second amplifier included in the power amplifier circuit, supports Power class 3. The power amplifier 32 is capable of amplifying transmit signals in Band A which are input from the radio-frequency input terminal 112. The power amplifier 32 is connected between the radio-frequency input terminal 112 and the filter 11.

The switch 52, which is an exemplary first switch, is connected between the power amplifier 31, and the filter 12 and the switch 53. Specifically, the switch 52 has a common terminal 52a (first common terminal) and selection terminals 52b (first selection terminal) and 52c (second selection terminal). The common terminal 52a is connected to the output terminal of the power amplifier 31; the selection terminal 52b is connected to the input end of the filter 12; the selection terminal 52c is connected to the input end of the filter 21 through the switch 53. Through this connection configuration, the switch 52 switches between connection between the power amplifier 31 and the filter 12 and connection between the power amplifier 31 and the filter 21, for example, on the basis of a control signal from the RFIC 3.

According to the configuration, assuming a Power-class-2 FDD signal in Band A is to be output from the antenna connection terminal 100, transmit signals, supporting Power class 3, may be output from the respective power amplifiers 31 and 32. Assuming a Power-class-2 TDD signal in Band B is to be output from the antenna connection terminal 100, a transmit signal, supporting Power class 2, may be output from the power amplifier 31. That is, an FDD signal in Band A is split for output from the two power amplifiers 31 and 32. Thus, the heat dissipation may be improved in the case of transmission of a Power-class-2 FDD signal. In addition, the power-added efficiency of the power amplifiers 31 and 32 may be improved, and noise occurring from the power amplifiers 31 and 32 and the filters 11 and 12 may be reduced.

[1.6 The Circuit Configuration of a Radio Frequency Circuit 1B According to a Second Modified Example]

Next, the circuit configuration of a radio frequency circuit 1B according to a second modified example will be described by referring to FIG. 4B.

Figure 4B:
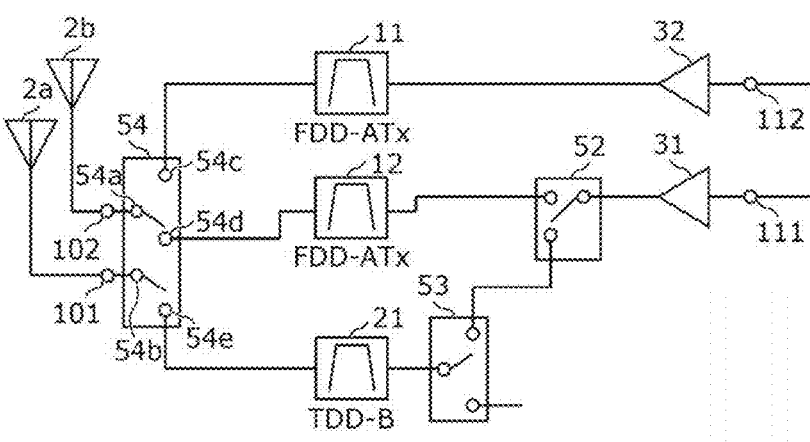
FIG. 4B is a circuit configuration diagram of a radio frequency circuit according to a second modified example of an embodiment.

FIG. 4B is a circuit configuration diagram of the radio frequency circuit 1B according to the second modified example of the embodiment. As illustrated in the figure, the radio frequency circuit 1B includes the filters 11, 12 and 21, the power amplifiers 31 and 32, switches 52, 53, and 54, antenna connection terminals 101 and 102, and the radio-frequency input terminals 111 and 112. The radio frequency circuit 1B according to the present modified example is different from the radio frequency circuit 1A according to the first modified example in the configuration of the switch 54 and in that the combiner circuit 42 is excluded. Description about points of the radio frequency circuit 1B according to the present modified example, which are identical to those of the radio frequency circuit 1A according to the first modified example, will be skipped below, and different points will be described mainly.

The antenna connection terminal 101, which is an exemplary first antenna connection terminal, is connected to an antenna 2a (first antenna). The antenna connection terminal 102, which is an exemplary second antenna connection terminal, is connected to an antenna 2b (second antenna) different from the antenna 2a.

The switch 54, which is an exemplary third switch, is connected between the antenna connection terminals 101 and 102 and the filters 11, 12, and 21. Specifically, the switch 54 has a common terminal 54a (fourth common terminal), a common terminal 54b (third common terminal), and selection terminals 54c (sixth selection terminal), 54d (fifth selection terminal), and 54e (seventh selection terminal). The common terminal 54a is connected to the antenna connection terminal 102; the common terminal 54b is connected to the antenna connection terminal 101; the selection terminal 54c is connected to the output end of the filter 11; the selection terminal 54d is connected to the output end of the filter 12; the selection terminal 54e is connected to the output end of the filter 21. Through this connection configuration, the switch 54 switches between connection and non-connection between the antenna connection terminal 102 and the filter 11, and switches between connection between the antenna connection terminal 101 and the filter 12 and connection between the antenna connection terminal 101 and the filter 21, for example, on the basis of a control signal from the RFIC 3.

According to the configuration, assuming a Power-class-2 FDD signal in Band A is to be output, transmit signals, supporting Power class 3, are output from the respective power amplifiers 31 and 32, and the two transmit signals are transmitted from the two antennas 2a and 2b. Assuming a Power-class-2 TDD signal in Band B is to be output, a transmit signal, supporting Power class 2, is output from the power amplifier 31, and the single transmit signal is transmitted from the single antenna 2a. That is, an FDD signal in Band A is split for output from the two power amplifiers 31 and 32. Thus, the heat dissipation may be improved in the case of transmission of a Power-class-2 FDD signal. In addition, the power-added efficiency of the power amplifiers 31 and 32 may be improved, and noise occurring from the power amplifiers 31 and 32 and the filters 11 and 12 may be reduced.

[1.7 The Circuit Configuration of a Radio Frequency Circuit 1C According to a Third Modified Example]

Next, the circuit configuration of a radio frequency circuit 1C according to a third modified example will be described by referring to FIG. 5A.

Figure 5A:
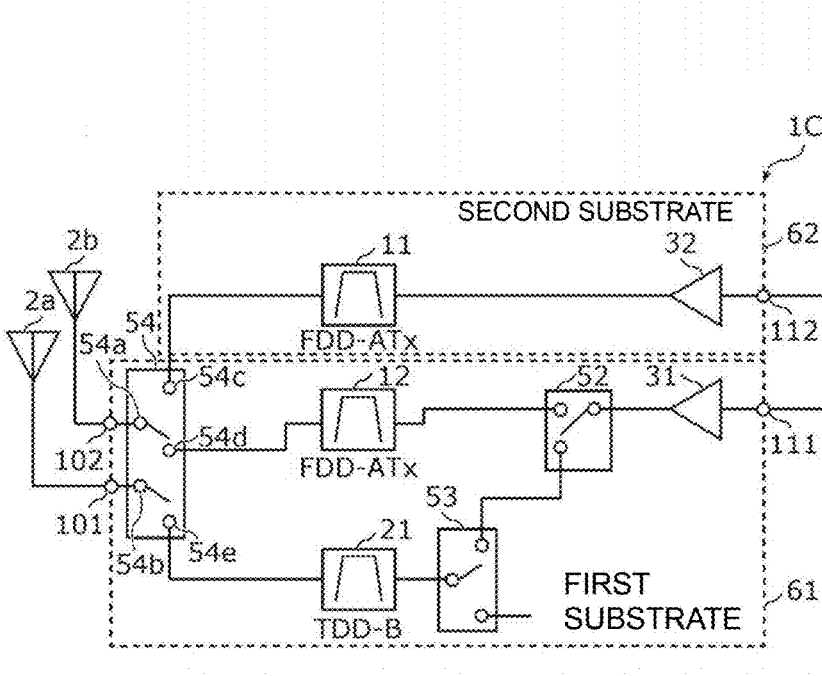
FIG. 5A is a circuit configuration diagram of a radio frequency circuit according to a third modified example of an embodiment.

FIG. 5A is a circuit configuration diagram of the radio frequency circuit 1C according to the third modified example of the embodiment. As illustrated in the figure, the radio frequency circuit 1C includes the filters 11, 12 and 21, the power amplifiers 31 and 32, the switches 52, 53, and 54, the antenna connection terminals 101 and 102, the radio-frequency input terminals 111 and 112, a first substrate 61, and a second substrate 62. The radio frequency circuit 1C according to the present modified example is different from the radio frequency circuit 1B according to the second modified example in that the first substrate 61 and the second substrate 62 are included. Description about points of the radio frequency circuit 1C according to the present modified example, which are identical to those of the radio frequency circuit 1B according to the second modified example, will be skipped below, and different points will be described mainly.

Each of the first substrate 61 and the second substrate 62 is a substrate on/in which circuit components included in the radio frequency circuit 1C are mounted. As each of the first substrate 61 and the second substrate 62, for example, a low temperature co-fired ceramics (Low Temperature Co-fired Ceramics: LTCC) substrate, a high temperature co-fired ceramics (High Temperature Co-fired Ceramics: HTCC) substrate, a component-embedded substrate, a substrate having a redistribution layer (Redistribution Layer: RDL), a printed board, or the like, which has a layered structure of multiple dielectric layers, is used.

In the radio frequency circuit 1C according to the present modified example, the power amplifier 31, the switches 52, 53, and 54, and the filters 12 and 21 are disposed on/in the first substrate 61; the power amplifier 32 and the filter 11 are disposed on/in the second substrate 62.

According to this, the power amplifier 31 and the power amplifier 32 are disposed on/in the different substrates, and the filter 11 and the filter 12 are disposed on/in the different substrates. Thus, the heat dissipation of the radio frequency circuit 1C may be improved, and degradation of the characteristics of the filters 11 and 12 may be suppressed.

[1.8 The Circuit Configuration of a Radio Frequency Circuit 1D According to a Fourth Modified Example]

Next, the circuit configuration of a radio frequency circuit 1D according to a fourth modified example will be described by referring to FIG. 5B.

Figure 5B:
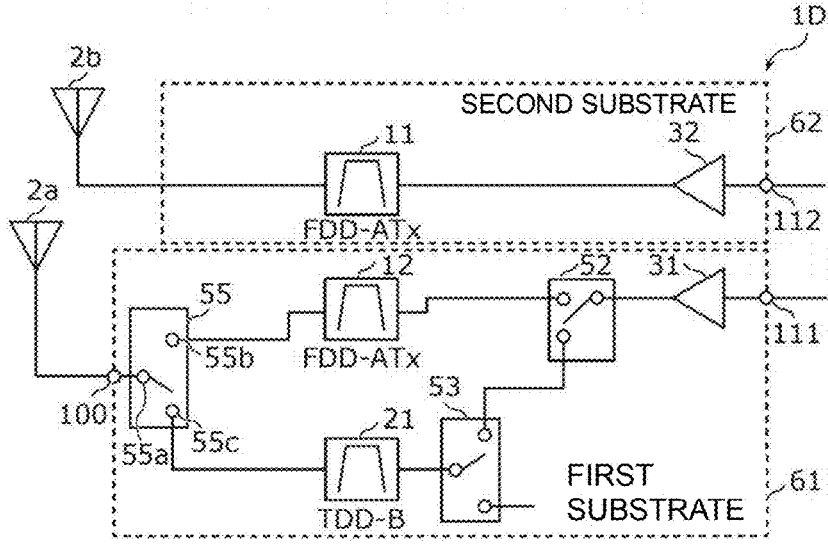
FIG. 5B is a circuit configuration diagram of a radio frequency circuit according to a fourth modified example of an embodiment.

FIG. 5B is a circuit configuration diagram of the radio frequency circuit 1D according to the fourth modified example of the embodiment. As illustrated in the figure, the radio frequency circuit 1D includes the filters 11, 12 and 21, the power amplifiers 31 and 32, switches 52, 53, and 55, the antenna connection terminal 100, the radio-frequency input terminals 111 and 112, the first substrate 61, and the second substrate 62. The radio frequency circuit 1D according to the present modified example is different from the radio frequency circuit 1C according to the third modified example in the connection configuration of the switch 55. Description about points of the radio frequency circuit 1D according to the present modified example, which are identical to those of the radio frequency circuit 1C according to the third modified example, will be skipped below, and different points will be described mainly.

The antenna connection terminal 100, which is an exemplary first antenna connection terminal, is connected to the antenna 2a (first antenna).

The switch 55, which is an exemplary second switch, is connected between the antenna connection terminal 100, and the filters 12 and 21. Specifically, the switch 55 has a common terminal 55a (second common terminal) and selection terminals 55b (third selection terminal) and 55c (fourth selection terminal). The common terminal 55a is connected to the antenna connection terminal 100; the selection terminal 55b is connected to the output end of the filter 12; the selection terminal 55c is connected to the output end of the filter 21. Through this connection configuration, the switch 55 switches between connection between the antenna connection terminal 100 and the filter 12 and connection between the antenna connection terminal 100 and the filter 21, for example, on the basis of a control signal from the RFIC 3.

The output end of the filter 11 is connected to the antenna 2b (second antenna) different from the antenna 2a.

In the radio frequency circuit 1D according to the present modified example, the power amplifier 31, the switches 52, 53, and 55, and the filters 12 and 21 are disposed on/in the first substrate 61; the power amplifier 32 and the filter 11 are disposed on/in the second substrate 62.

According to this, the power amplifier 31 and the power amplifier 32 are disposed on/in the different substrates, and the filter 11 and the filter 12 are disposed on/in the different substrates. Thus, the heat dissipation of the radio frequency circuit 1D may be improved, and degradation of the characteristics of the filters 11 and 12 may be suppressed.

[1.9 The Circuit Configuration of a Radio Frequency Circuit 1G According to a Fifth Modified Example]

Next, the circuit configuration of a radio frequency circuit 1G according to a fifth modified example, which uses three power amplifiers and three antennas, will be described by referring to FIG. 5C.

Figure 5C:
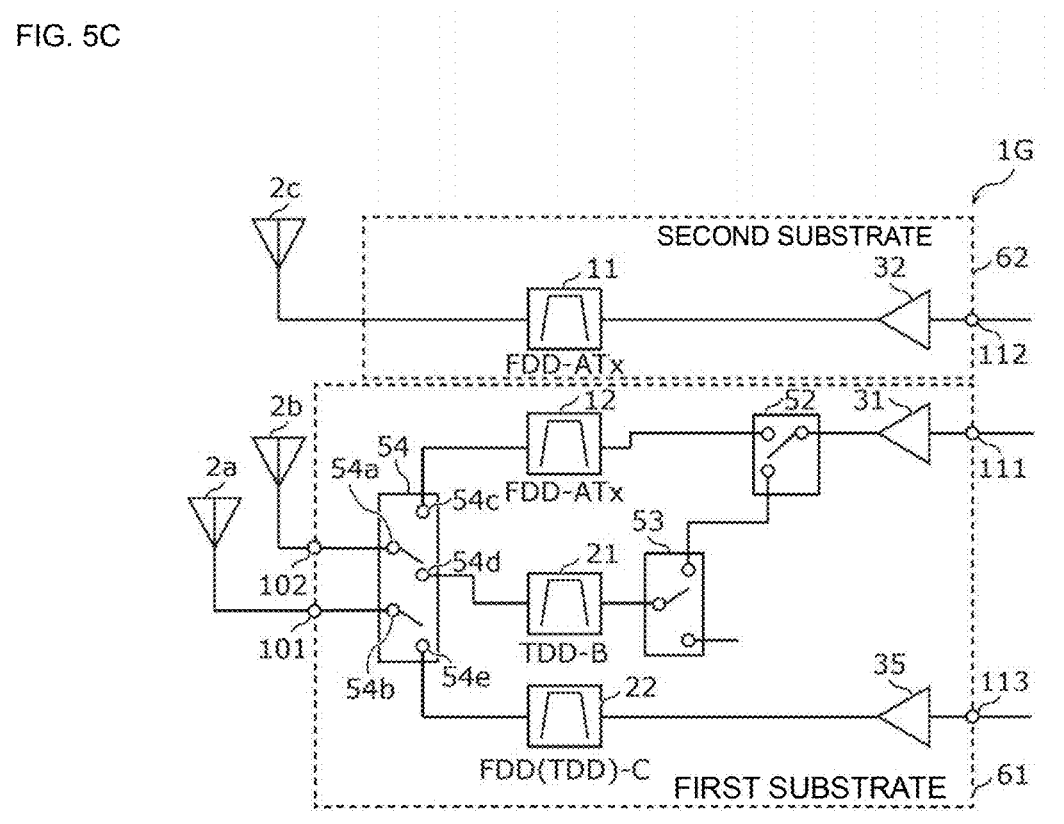

FIG. 5C is a circuit configuration diagram of the radio frequency circuit 1G according to the fifth modified example of the embodiment. As illustrated in the figure, the radio frequency circuit 1G includes filters 11, 12, 21, and 22, power amplifiers 31, 32, and 35, the switches 52, 53, and 54, the antenna connection terminals 101 and 102, radio-frequency input terminals 111, 112, and 113, the first substrate 61, and the second substrate 62. The radio frequency circuit 1G according to the present modified example is different from the radio frequency circuit 1D according to the fourth modified example in that the filter 22 having a passband including Band C is added, and in the configuration of the switch 54. Description about points of the radio frequency circuit 1G according to the present modified example, which are identical to those of the radio frequency circuit 1D according to the fourth modified example, will be skipped below, and different points will be described mainly.

The antenna connection terminal 101, which is an exemplary first antenna connection terminal, is connected to the antenna 2a (first antenna). The antenna connection terminal 102, which is an exemplary second antenna connection terminal, is connected to the antenna 2b (second antenna) different from the antenna 2a.

Each of the radio-frequency input terminals 111, 112, and 113 is a terminal for receiving transmit signals from the outside of the radio frequency circuit 1G (RFIC 3).

The filter 11, which is an exemplary second filter, supports Power class 3, and has a passband including the uplink operating band of Band A for FDD. The filter 11 is connected to the power amplifier 32.

The filter 12, which is an exemplary first filter, supports Power class 3, and has a passband including the uplink operating band of Band A for FDD. The filter 12 is connected to the power amplifier 31 through the switch 52.

The filter 21, which is an exemplary third filter, supports Power class 2, and has a passband including Band B for TDD. The filter 21 is connected to the power amplifier 31 through the switches 52 and 53.

The filter 22 has a passband including the uplink operating band of Band C for FDD, which is different from Band A and Band B. The filter 22 is connected to the power amplifier 35. The filter 22 may have a passband including Band C for TDD.

The power amplifier 31, which is an exemplary first amplifier included in the power amplifier circuit, supports Power class 2. The power amplifier 31 is capable of amplifying transmit signals in Band A and Band B which are input from the radio-frequency input terminal 111. The power amplifier 31 is connected between the radio-frequency input terminal 111 and the switch 52.

The power amplifier 32, which is an exemplary second amplifier included in the power amplifier circuit, supports Power class 3. The power amplifier 32 is capable of amplifying transmit signals in Band A which are input from the radio-frequency input terminal 112. The power amplifier 32 is connected between the radio-frequency input terminal 112 and the filter 11.

The power amplifier 35 is capable of amplifying transmit signals in Band C which are input from the radio-frequency input terminal 113. The power amplifier 35 is connected between the radio-frequency input terminal 113 and the filter 22.

The switch 54 is connected between the antenna connection terminals 101 and 102 and the filters 12, 21, and 22. Specifically, the switch 54 has the common terminal 54a, the common terminal 54b, the selection terminals 54c, 54d, and 54e. The common terminal 54a is connected to the antenna connection terminal 102; the common terminal 54b is connected to the antenna connection terminal 101; the selection terminal 54c is connected to the output end of the filter 12; the selection terminal 54d is connected to the output end of the filter 21; the selection terminal 54e is connected to the output end of the filter 22. Through this connection configuration, the switch 54 switches between connection between the antenna connection terminal 102 and the filter 12 and connection between the antenna connection terminal 102 and the filter 21, and switches between connection and non-connection between the antenna connection terminal 101 and the filter 22, for example, on the basis of a control signal from the RFIC 3.

In the radio frequency circuit 1G according to the present modified example, the power amplifiers 31 and 35, the switches 52, 53, and 54, and the filters 12, 21, and 22 are disposed on/in the first substrate 61, and the power amplifier 32 and the filter 11 are disposed on/in the second substrate 62.

According to the configuration, assuming a Power-class-2 FDD signal in Band A and an FDD (or TDD) signal in Band C are to be output simultaneously (two uplinks), the common terminal 54a is connected to the selection terminal 54c, and the common terminal 54b is connected to the selection terminal 54e. Thus, each of the power amplifiers 31 and 32 outputs a transmit signal in Band A, which supports Power class 3, and the two transmit signals are transmitted from the two antennas 2b and 2c. At the same time, a transmit signal in Band C is output from the power amplifier 35, and the transmit signal is transmitted from the antenna 2a.

Assuming a Power-class-3 FDD signal in Band A, a TDD signal in Band B, and an FDD (or TDD) signal in Band C are to be output simultaneously (three uplinks), the common terminal 54a is connected to the selection terminal 54d, and the common terminal 54b is connected to the selection terminal 54e. Thus, a transmit signal in Band A, which supports Power class 3, is output from the power amplifier 32, and the transmit signal is transmitted from the antenna 2c. At the same time, a transmit signal in Band B is output from the power amplifier 31, and the transmit signal is transmitted from the antenna 2b. Further, at the same time, a transmit signal in Band C is output from the power amplifier 35, and the transmit signal is transmitted from the antenna 2a. In the radio frequency module circuit 1G according to the present modified example, an FDD signal in Band A is split for output from the two power amplifiers 31 and 32. Thus, the heat dissipation may be improved in the case of transmission of a Power-class-2 FDD signal. In addition, the power-added efficiency of the power amplifiers 31 and 32 may be improved, and noise occurring from the power amplifiers 31 and 32 and the filters 11 and 12 may be reduced.

[1.10 The Circuit Configuration of a Radio Frequency Circuit 1E According to a Sixth Modified Example]

Next, the circuit configuration of a radio frequency circuit 1E according to a sixth modified example will be described by referring to FIG. 6.

Figure 6:
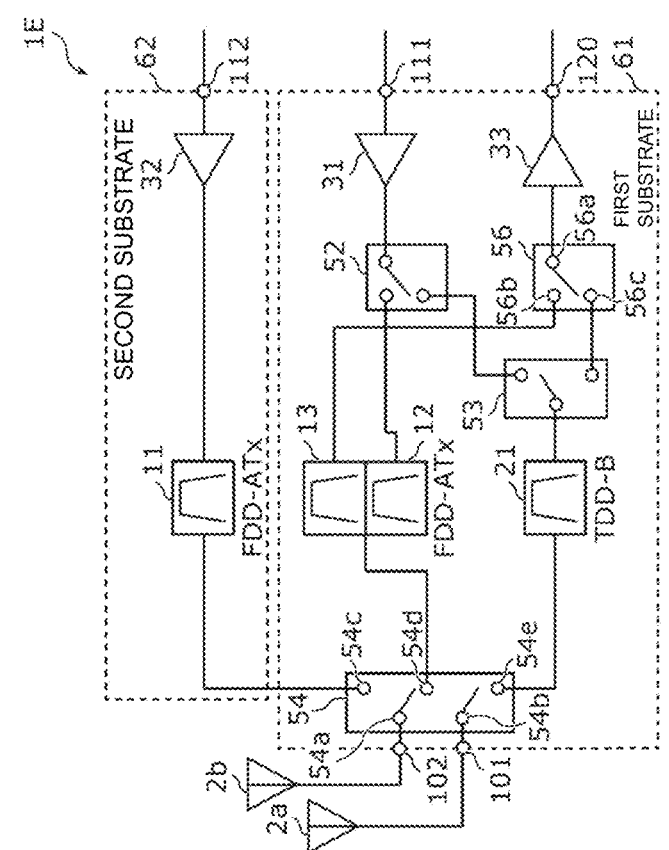
FIG. 6 is a circuit configuration diagram of a radio frequency circuit according to a sixth modified example of an embodiment.

FIG. 6 is a circuit configuration diagram of the radio frequency circuit 1E according to the sixth modified example of the embodiment. As illustrated in the figure, the radio frequency circuit 1E includes filters 11, 12, 13, and 21, the power amplifiers 31 and 32, a low-noise amplifier 33, switches 52, 53, 54, and 56, the antenna connection terminals 101 and 102, the radio-frequency input terminals 111 and 112, a radio-frequency output terminal 120, the first substrate 61, and the second substrate 62. The radio frequency circuit 1E according to the present modified example is different from the radio frequency circuit 1C according to the third modified example in that the filter 13, the low-noise amplifier 33, and the switch 56 are added. Description about points of the radio frequency circuit 1E according to the present modified example, which are identical to those of the radio frequency circuit 1C according to the third modified example, will be skipped below, and different points will be described mainly.

The radio-frequency output terminal 120 is an output terminal for supplying the outside of the radio frequency circuit 1E (RFIC 3) with receive signals in Band A for FDD and receive signals in Band B for TDD.

The filter 13, which is an exemplary fourth filter, has a passband including the downlink operating band of Band A for FDD. The input end of the filter 13 is connected to the output end of the filter 12 and the selection terminal 54d; the output end of the filter 13 is connected to the input terminal of the low-noise amplifier 33 through the switch 56. The filters 12 and 13 constitute a duplexer for Band A.

The low-noise amplifier 33 is capable of amplifying receive signals in Band A and Band B which are input from the antenna connection terminal 101. The low-noise amplifier 33 is connected between the radio-frequency output terminal 120 and the switch 56.

The switch 56 is connected between the filters 13 and 21 and the low-noise amplifier 33. Specifically, the switch 56 has a common terminal 56a and selection terminals 56b and 56c. The common terminal 56a is connected to the input terminal of the low-noise amplifier 33; the selection terminal 56b is connected to the output end of the filter 13; the selection terminal 56c is connected to the output end of the filter 21 through the switch 53. Through this connection configuration, the switch 56 switches between connection between the low-noise amplifier 33 and the filter 13 and connection between the low-noise amplifier 33 and the filter 21, for example, on the basis of a control signal from the RFIC 3.

In the radio frequency circuit 1E according to the present modified example, the power amplifier 31, the low-noise amplifier 33, the switches 52, 53, 54, and 56, and the filters 12, 13, and 21 are disposed on/in the first substrate 61, and the power amplifier 32 and the filter 11 are disposed on/in the second substrate 62. A filter having a passband including the downlink operating band of Band A is not disposed on/in the second substrate.

According to this, each of the filters 11 and 12, which has difficulty in transmission of a Power-class-2 transmit signal for FDD with use of only the single filter, transmits a Power-class-3 transmit signal (for example, 23 dBm). This enables a Power-class-2 transmit signal for FDD to be transmitted without degradation of the bandpass characteristics of the filters 11 and 12.

In addition, an FDD signal in Band A is split for output from the two power amplifiers 31 and 32. Thus, the heat dissipation may be improved in the case of transmission of a Power-class-2 FDD signal; the power-added efficiency of the power amplifiers 31 and 32 may be improved; noise occurring from the filters 11 and 12 and the power amplifiers 31 and 32 may be reduced. Further, the reduction of noise improves the receiver sensitivity of receive signals in Band A for the receive path on which the low-noise amplifier 33 is disposed.

The power amplifier 31 and the power amplifier 32 are disposed on/in the different substrates, and the filter 11 and the filter 12 are disposed on/in the different substrates. Thus, the heat dissipation of the radio frequency circuit 1E is improved, and degradation of the characteristics of the filters 11 and 12 may be suppressed. Further, only the filter 12 among the filters 11 and 12 constitutes a duplexer in Band A together with the filter 13. Thus, the number of filters may be reduced.

The radio frequency circuit 1E according to the present modified example does not necessarily include the low-noise amplifier 33 and the switch 56.

[1.11 The Circuit Configuration of a Radio Frequency Circuit 1F According to a Seventh Modified Example]

Next, the circuit configuration of a radio frequency circuit 1F according to a seventh modified example will be described by referring to FIG. 7.

Figure 7:
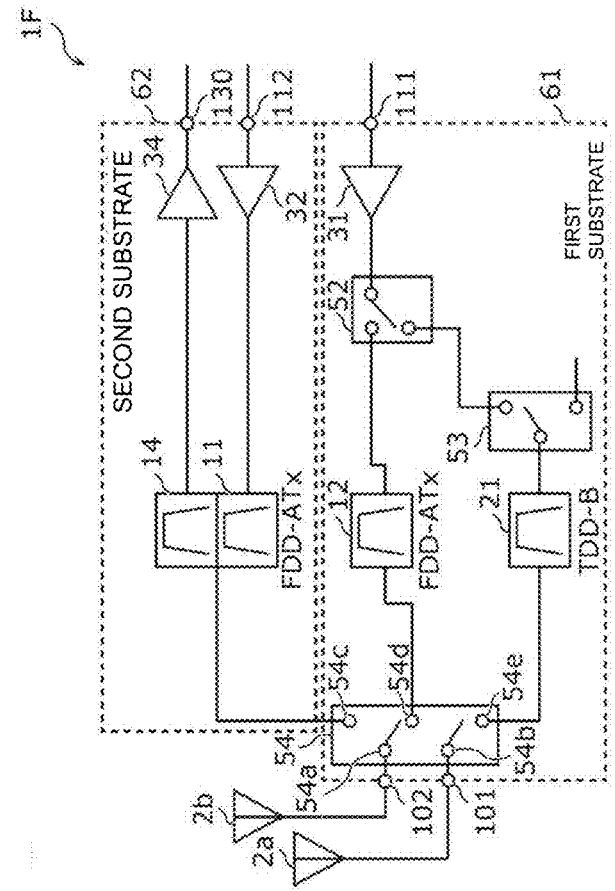
FIG. 7 is a circuit configuration diagram of a radio frequency circuit according to a seventh modified example of an embodiment.

FIG. 7 is a circuit configuration diagram of the radio frequency circuit 1F according to the seventh modified example of the embodiment. As illustrated in the figure, the radio frequency circuit 1F includes filters 11, 12, 14, and 21, the power amplifiers 31 and 32, a low-noise amplifier 34, the switches 52, 53, and 54, the antenna connection terminals 101 and 102, the radio-frequency input terminals 111 and 112, a radio-frequency output terminal 130, the first substrate 61, and the second substrate 62. The radio frequency circuit 1F according to the present modified example is different from the radio frequency circuit 1C according to the third modified example in that the filter 14 and the low-noise amplifier 34 are added. Description about points of the radio frequency circuit 1F according to the present modified example, which are identical to those of the radio frequency circuit 1C according to the third modified example, will be skipped below, and different points will be described mainly.

The radio-frequency output terminal 130 is an output terminal for supplying the outside of the radio frequency circuit 1F (RFIC 3) with receive signals in Band A for FDD.

The filter 14, which is an exemplary fifth filter, has a passband including the downlink operating band of Band A for FDD. The input end of the filter 14 is connected to the output end of the filter 11 and the selection terminal 54c; the output end of the filter 14 is connected to the input terminal of the low-noise amplifier 34. The filters 11 and 14 constitute a duplexer for Band A. The filter 14 does not necessarily include the downlink operating band of Band A as a passband, and may be a filter including the downlink operating band of a band other than Band A as a passband.

The low-noise amplifier 34 is capable of amplifying receive signals in Band A which are input from the antenna connection terminal 102. The low-noise amplifier 34 is connected between the radio-frequency output terminal 130 and the filter 14.

In the radio frequency circuit 1F according to the present modified example, the power amplifier 31, the switches 52, 53, and 54, and the filters 12 and 21 are disposed on/in the first substrate 61, and the power amplifier 32, the low-noise amplifier 34, and the filters 11 and 14 are disposed on/in the second substrate 62.

According to this, each of the filters 11 and 12, which has difficulty in transmission of a Power-class-2 transmit signal for FDD with use of only the single filter, transmits a Power-class-3 transmit signal (for example, 23 dBm). This enables a Power-class-2 transmit signal for FDD to be transmitted without degradation of the bandpass characteristics of the filters 11 and 12.

In addition, an FDD signal in Band A is split for output from the two power amplifiers 31 and 32. Thus, the heat dissipation may be improved in the case of transmission of a Power-class-2 FDD signal; the power-added efficiency of the power amplifiers 31 and 32 may be improved; noise occurring from the filters 11 and 12 and the power amplifiers 31 and 32 may be reduced.

In addition, the power amplifier 31 and the power amplifier 32 are disposed on/in the different substrates, and the filter 11 and the filter 12 are disposed on/in the different substrates. Thus, the heat dissipation of the radio frequency circuit 1F may be improved, and degradation of the characteristics of the filters 11 and 12 may be suppressed. In addition, the filter 14 and the low-noise amplifier 34 are disposed on/in the second substrate 62 on/in which the filters 12 and 21 are not disposed. Thus, the heat dissipation of the radio frequency circuit 1F may be improved, and degradation of the receiver sensitivity in Band A for the receive path, on which the filter 14 and the low-noise amplifier 34 are disposed, may be suppressed.

Among the radio frequency circuits according to the present disclosure, the radio frequency circuit 1C according to the third modified example, the radio frequency circuit 1E according to the sixth modified example, and the radio frequency circuit 1F according to the seventh modified example may include the first substrate 61 and only the circuit components disposed on/in the first substrate 61.

That is, a radio frequency circuit according to the present disclosure may include the first substrate 61, the antenna connection terminals 101 and 102, the power amplifier 31, which supports Power class 2, the filter 12, which is connected between the power amplifier 31 and the antenna connection terminal 101, which supports Power class 3, and which has a passband including the uplink operating band of Band A for FDD, the filter 21, which is connected between the power amplifier 31 and the antenna connection terminal 101, which supports Power class 2, and which has a passband including Band B for TDD, the switch 52, and the switch 54. The output terminal of the power amplifier 31 is connected to the common terminal 52a; the selection terminal 52b is connected to the input end of the filter 12; the selection terminal 52c is connected to the input end of the filter 21; the common terminal 54b is connected to the antenna connection terminal 101; the common terminal 54a is connected to the antenna connection terminal 102; the selection terminal 54d is connected to the output end of the filter 12; the selection terminal 54e is connected to the output end of the filter 21. The power amplifier 31, the switches 52 and 54, and the filters 12 and 21 are disposed on/in the first substrate 61. In this case, in the case of output of a transmit signal in Band A, which supports Power class 2, assuming a transmit signal in the uplink operating band of Band A, which supports Power class 3, is being input at the selection terminal 54c from the power amplifier 32 different from the power amplifier 31, a transmit signal in the uplink operating band of Band A, which supports Power class 3, is output from the power amplifier 31 to the filter 12. In contrast, in the case of output of a transmit signal in Band B, which supports Power class 2, a transmit signal in Band B is output from the power amplifier 31 to the filter 21.

This allows a Power-class-2 transmit signal for TDD to be transmitted by the filter 21. In contrast to a Power-class-2 transmit signal for TDD, a Power-class-2 transmit signal for FDD, which is transmitted continuously, not in a time division manner, has a high power density. Assuming the filter 11 or 12 alone transmits the transmit signal, the filter enters the high temperature state, and the electric power handling capability enters the critical state. Therefore, the bandpass characteristics of the filter 12 may degrade. In contrast, the filter 12, which has difficulty in transmission of a Power-class-2 transmit signal for FDD with use of only the single filter, transmits a Power-class-3 transmit signal (for example, 23 dBm), and so does the filter 11. This enables a Power-class-2 transmit signal for FDD to be transmitted without degradation of the bandpass characteristics of the filter 12.

[2 Effects and the Like]

As described above, the radio frequency circuit 1 according to the present embodiment includes the antenna connection terminal 100, the power amplifier 30, which supports Power class 2, the filter 12, which is connected between the power amplifier 30 and the antenna connection terminal 100, which supports Power class 3, and which has a passband including the uplink operating band of Band A for FDD, the filter 11, which is connected between the power amplifier 30 and the antenna connection terminal 100, which supports Power class 3, and which has a passband including the uplink operating band of Band A, and the filter 21, which is connected between the power amplifier 30 and the antenna connection terminal 100, which supports Power class 2, and which has a passband including Band B for TDD. Assuming a transmit signal in Band A, which supports Power class 2, is to be output from the antenna connection terminal 100, the transmit signal in Band A from the power amplifier 30 is split for output to the filters 11 and 12. Assuming a transmit signal in Band B, which supports Power class 2, is to be output from the antenna connection terminal 100, the transmit signal in Band B is output from the power amplifier 30 to the filter 21.

This enables a Power-class-2 transmit signal for TDD to be transmitted by the filter 21. In contrast, a Power-class-2 transmit signal for FDD, which is transmitted continuously, not in a time division manner, has a high power density. Assuming the transmit signal is transmitted by the filter 11 or 12 alone, the filter enters the high temperature state, and the electric power handling capability enters the critical state. Therefore, the bandpass characteristics of the filter 11 or 12 may degrade. In contrast, each of the filters 11 and 12, which has difficulty in transmission of a Power-class-2 transmit signal for FDD with use of only the single filter, transmits a Power-class-3 transmit signal (for example, 23 dBm). This enables a Power-class-2 transmit signal for FDD to be transmitted without degradation of the filter bandpass characteristics. Thus, in the case of application of a power class, which allows maximum output power higher than a conventional one, to a band for FDD, the radio frequency circuit 1, which causes degradation of the transmission characteristics to be suppressed, may be provided.

In addition, for example, the radio frequency circuit 1 may further include the splitter circuit 41, which has the terminals 41a, 41b, and 41c and splits, for output from the terminals 41b and 41c, a signal that is input at the terminal 41a, and the combiner circuit 42, which has the terminals 42a, 42b, and 42c and combines, for output from the terminal 42a, signals that are input at the terminals 42b and 42c. The terminal 41a may be connected to the output terminal of the power amplifier 30; the terminal 41b may be connected to the input end of the filter 11; the terminal 41c may be connected to the input end of the filter 12; the terminal 42b may be connected to the output end of the filter 11; the terminal 42c may be connected to the output end of the filter 12; the terminal 42a may be connected to the antenna connection terminal 100.

This may simplify the transmit circuit for transmission in Band A.

In addition, for example, the radio frequency circuit 1 may further include the switch 52, which has the common terminal 52a and the selection terminals 52b and 52c, and which switches between connection between the common terminal 52a and the selection terminal 52b and connection between the common terminal 52a and the selection terminal 52c, and the switch 51, which has the common terminal 51a and the selection terminals 51b and 51c, and which switches between connection between the common terminal 51a and the selection terminal 51b and connection between the common terminal 51a and the selection terminal 51c. The common terminal 52a may be connected to the output terminal of the power amplifier 30; the selection terminal 52b may be connected to the terminal 41a; the selection terminal 52c may be connected to the input end of the filter 21; the common terminal 51a may be connected to the antenna connection terminal 100; the selection terminal 51b may be connected to the terminal 42a; the selection terminal 51c may be connected to the output end of the filter 21.

This enables a transmit signal in Band A and a transmit signal in Band B to be transmitted with high isolation.

In addition, for example, the radio frequency circuit 1A according to the first modified example may include the power amplifier 31, which supports Power class 2, the power amplifier 32, which supports Power class 3, the filters 11, 12 and 21, the switch 52, the switch 51, and the combiner circuit 42. The output terminal of the power amplifier 31 may be connected to the common terminal 52a; the output terminal of the power amplifier 32 may be connected to the input end of the filter 11; the selection terminal 52b may be connected to the input end of the filter 12; the selection terminal 52c may be connected to the input end of the filter 21; the terminal 42b may be connected to the output end of the filter 11; the terminal 42c may be connected to the output end of the filter 12; the terminal 42a may be connected to the selection terminal 51b; the common terminal 51a may be connected to the antenna connection terminal 100; the selection terminal 51c may be connected to the output end of the filter 21.

According to this, assuming a Power-class-2 FDD signal in Band A is to be output, a transmit signal, which supports Power class 3, may be output from each of the power amplifiers 31 and 32. Assuming a Power-class-2 TDD signal in Band B is to be output, a transmit signal, which supports Power class 2, may be output from the power amplifier 31.

That is, an FDD signal in Band A is split for output from the two power amplifiers 31 and 32. This may improve the heat dissipation in the case of transmission of a Power-class-2 FDD signal. In addition, the power-added efficiency of the power amplifiers 31 and 32 may be improved, and noise occurring from the power amplifiers 31 and 32 and the filters 11 and 12 may be reduced.

In addition, for example, the radio frequency circuit 1B according to the second modified example includes the antenna connection terminals 101 and 102, the power amplifiers 31 and 32, the filters 11, 12 and 21, the switch 52, and the switch 54. The output terminal of the power amplifier 31 may be connected to the common terminal 52a; the output terminal of the power amplifier 32 may be connected to the input end of the filter 11; the selection terminal 52b may be connected to the input end of the filter 12; the selection terminal 52c may be connected to the input end of the filter 21; the common terminal 54b may be connected to the antenna connection terminal 101; the common terminal 54a may be connected to the antenna connection terminal 102; the selection terminal 54d may be connected to the output end of the filter 12; the selection terminal 54c may be connected to the output end of the filter 11; the selection terminal 54e may be connected to the output end of the filter 21.

According to this, assuming a Power-class-2 FDD signal in Band A is to be output, transmit signals, which support Power class 3, are output from the respective power amplifiers 31 and 32 for transmission from the two antennas 2a and 2b. Assuming a Power-class-2 TDD signal in Band B is to be output, a transmit signal, which supports Power class 2, is output from the power amplifier 31 for transmission from the single antenna 2a. That is, an FDD signal in Band A is split for output from the two power amplifiers 31 and 32. Thus, the heat dissipation may be improved in the case of transmission of a Power-class-2 FDD signal. In addition, the power-added efficiency of the power amplifiers 31 and 32 may be improved, and noise occurring from the power amplifiers 31 and 32 and the filters 11 and 12 may be reduced.

In addition, for example, compared with the radio frequency circuit 1B, the radio frequency circuit 1C according to the third modified example may further include the first substrate 61 and the second substrate 62. The power amplifier 31, the switches 52 and 54, and the filters 12 and 21 may be disposed on/in the first substrate 61. The power amplifier 32 and the filter 11 may be disposed on/in the second substrate 62.

According to this, the power amplifier 31 and the power amplifier 32 are disposed on/in the different substrates, and the filter 11 and the filter 12 are disposed on/in the different substrates. Thus, the heat dissipation of the radio frequency circuit 1C may be improved, and degradation of the characteristics of the filters 11 and 12 may be suppressed.

In addition, for example, the radio frequency circuit 1D according to the fourth modified example may include the antenna connection terminal 100, the power amplifiers 31 and 32, the filters 11, 12, and 21, the switch 52, the switch 55, the first substrate 61, and the second substrate 62. The output terminal of the power amplifier 31 may be connected to the common terminal 52a; the output terminal of the power amplifier 32 may be connected to the input end of the filter 11; the selection terminal 52b may be connected to the input end of the filter 12; the selection terminal 52c may be connected to the input end of the filter 21; the common terminal 55a may be connected to the antenna connection terminal 100; the selection terminal 55b may be connected to the output end of the filter 12; the selection terminal 55*c* may be connected to the output end of the filter 21. The power amplifier 31, the switches 52 and 55, and the filters 12 and 21 may be disposed on/in the first substrate 61. The power amplifier 32 and the filter 11 may be disposed on/in the second substrate 62.

According to this, the power amplifier 31 and the power amplifier 32 are disposed on/in the different substrates, and the filter 11 and the filter 12 are disposed on/in the different substrates. Thus, the heat dissipation of the radio frequency circuit 1D may be improved, and degradation of the characteristics of the filters 11 and 12 may be suppressed.

In addition, for example, the radio frequency circuit 1E according to the sixth modified example may include the antenna connection terminals 101 and 102, the power amplifiers 31 and 32, the filters 11, 12 and 21, the filter 13, which has a passband including the downlink operating band of Band A, the switch 52, the switch 54, the first substrate 61, and the second substrate 62. The output terminal of the power amplifier 31 may be connected to the common terminal 52*a*; the output terminal of the power amplifier 32 may be connected to the input end of the filter 11; the selection terminal 52*b* may be connected to the input end of the filter 12; the selection terminal 52*c* may be connected to the input end of the filter 21; the common terminal 54*b* may be connected to the antenna connection terminal 101; the common terminal 54*a* may be connected to the antenna connection terminal 102; the selection terminal 54*d* may be connected to the output end of the filter 12 and the input end of the filter 13; the selection terminal 54*c* may be connected to the output end of the filter 11. The power amplifier 31, the switches 52 and 54, the filters 12, 13, and 21 may be disposed on/in the first substrate 61. The power amplifier 32 and the filter 11 may be disposed on/in the second substrate 62.

According to this, an FDD signal in Band A is split for output from the two power amplifiers 31 and 32. Thus, the heat dissipation may be improved in the case of transmission of a Power-class-2 FDD signal. In addition, the power-added efficiency of the power amplifiers 31 and 32 may be improved, and noise occurring from the filters 11 and 12 and the power amplifiers 31 and 32 may be reduced. Further, the reduction of noise may improve the receiver sensitivity of receive signals in Band A for the receive path on which the low-noise amplifier 33 is disposed. In addition, the power amplifier 31 and the power amplifier 32 are disposed on/in the different substrates, and the filter 11 and the filter 12 are disposed on/in the different substrates. Thus, the heat dissipation of the radio frequency circuit 1E may be improved, and degradation of the characteristics of the filters 11 and 12 may be suppressed. Further, only the filter 12 among the filters 11 and 12 constitutes a duplexer in Band A together with the filter 13. Thus, the number of filters may be reduced.

In addition, for example, the radio frequency circuit 1F according to the seventh modified example may include the antenna connection terminals 101 and 102, the power amplifiers 31 and 32, the filters 11, 12 and 21, the filter 14, which has a passband including the downlink operating band for FDD, the switch 52, the switch 54, the first substrate 61, and the second substrate 62. The output terminal of the power amplifier 31 may be connected to the common terminal 52*a*; the output terminal of the power amplifier 32 may be connected to the input end of the filter 11; the selection terminal 52*b* may be connected to the input end of the filter 12; the selection terminal 52*c* may be connected to the input end of the filter 21; the common terminal 54*b* may be connected to the antenna connection terminal 101; the common terminal 54*a* may be connected to the antenna connection terminal 102; the selection terminal 54*d* may be connected to the output end of the filter 12; the selection terminal 54*c* may be connected to the output end of the filter 11 and the input end of the filter 14; the output end of the filter 14 may be connected to the input terminal of the low-noise amplifier 34. The power amplifier 31, the switches 52 and 54, and the filters 12 and 21 are disposed on/in the first substrate 61. The power amplifier 32, the low-noise amplifier 34, and the filters 11 and 14 may be disposed on/in the second substrate 62.

According to this, the power amplifier 31 and the power amplifier 32 are disposed on/in the different substrates, and the filter 11 and the filter 12 are disposed on/in the different substrates. Thus, the heat dissipation of the radio frequency circuit 1F may be improved, and degradation of the characteristics of the filters 11 and 12 may be suppressed. In addition, the filter 14 and the low-noise amplifier 34 are disposed on/in the second substrate 62 on/in which the filters 12 and 21 are not disposed. Thus, the heat dissipation of the radio frequency circuit 1F may be improved, and degradation of the receiver sensitivity in Band A for the receive path, on which the filter 14 and the low-noise amplifier 34 are disposed, may be suppressed.

In addition, for example, a radio frequency circuit according to the present disclosure may include the first substrate 61, the power amplifier 31, the filter 12, the filter 21, the antenna connection terminals 101 and 102, and the switches 52 and 54. In this case, in the case of output of a transmit signal in Band A, which supports Power class 2, assuming a transmit signal in the uplink operating band of Band A, which supports Power class 3, is being input at the selection terminal 54*c* from the power amplifier 32 different from the power amplifier 31, a transmit signal in the uplink operating band of Band A, which supports Power class 3, is output from the power amplifier 31 to the filter 12. In contrast, in the case of output of a transmit signal in Band B, which supports Power class 2, a transmit signal in Band B is output from the power amplifier 31 to the filter 21.

This enables a Power-class-2 transmit signal for TDD to be transmitted by the filter 21. In contrast to a Power-class-2 transmit signal for TDD, a Power-class-2 transmit signal for FDD, which is transmitted continuously, not in a time division manner, has a high power density. Assuming the transmit signal is transmitted by the filter 11 or 12 alone, the filter enters the high temperature state, and the electric power handling capability enters the critical state. Therefore, the bandpass characteristics of the filter 12 may degrade. In contrast, the filter 12, which has difficulty in transmission of a Power-class-2 transmit signal for FDD with use of only the single filter, transmits a Power-class-3 transmit signal, and so does the filter 11. This enables a Power-class-2 transmit signal for FDD to be transmitted without degradation of the bandpass characteristics of the filter 12.

In addition, the communication device 5 according to the present embodiment includes the RFIC 3, which processes radio frequency signals, and the radio frequency circuit 1, which transmits radio frequency signals between the RFIC 3 and the antenna 2.

According to this, the communication device 5 may exert effects similar to the effects of the radio frequency circuit 1.

OTHER EMBODIMENTS

A radio frequency circuit and a communication device according to the present disclosure are described above on the basis of the embodiment and the modified examples. A radio frequency circuit and a communication device according to the present disclosure are not limited to the embodiment and the modified examples. The present disclosure encompasses different embodiments, which are implemented by combining any components in the embodiment and the modified examples, modified examples, which are obtained by making, on the embodiment and the modified examples, various modifications conceived by those skilled in the art without departing from the gist of the present disclosure, and various devices, which include the radio frequency circuit and the communication device.

For example, in the circuit configuration of the radio frequency circuit and the communication device according to the embodiment and the modified examples, different circuit devices, wiring, and the like may be inserted between paths connecting the circuit devices and signal paths which are illustrated in the drawings.

In the embodiment, a band for 5G-NR or LTE is used. In addition to or instead of 5G-NR or LTE, a communication band for a different radio access technology may be used. For example, a communication band for the wireless local area network may be used. Alternatively, for example, a millimeter band equal to or more than 7 gigahertz may be used. In this case, the radio frequency circuit 1, the antenna 2, and the RFIC 3 constitute a millimeter-wave antenna module. As a filter, for example, a distributed parameter filter may be used.

INDUSTRIAL APPLICABILITY

The present disclosure may be used, as a radio frequency circuit disposed in a front-end unit, widely in communication devices such as a cellular phone.

The invention claimed is:
1. A radio frequency circuit comprising:
an antenna connection terminal;
a power amplifier circuit that supports Power class 2;
a first filter that is connected between the power amplifier circuit and the antenna connection terminal, that supports Power class 3, and that has a passband including an uplink operating band of a first band for frequency division duplex;
a second filter that is connected between the power amplifier circuit and the antenna connection terminal, that supports Power class 3, and that has a passband including the uplink operating band of the first band; and
a third filter that is connected between the power amplifier circuit and the antenna connection terminal, that supports Power class 2, and that has a passband including a second band for time division duplex,
wherein, assuming a transmit signal in the first band, which supports Power class 2, is to be output from the antenna connection terminal, a transmit signal in the first band from the power amplifier circuit is split for output to the first filter and the second filter, and
wherein, assuming a transmit signal in the second band, which supports Power class 2, is to be output from the antenna connection terminal, a transmit signal in the second band is output from the power amplifier circuit to the third filter.
2. The radio frequency circuit according to claim 1, further comprising:
a splitter circuit that has a first terminal, a second terminal, and a third terminal, and that splits power of a signal, which is input at the first terminal, for output from the second terminal and the third terminal; and
a combiner circuit that has a fourth terminal, a fifth terminal, and a sixth terminal, and that combines power of signals, which are input at the fourth terminal and the fifth terminal, for output from the sixth terminal,
wherein the first terminal is connected to an output terminal of the power amplifier circuit, the second terminal is connected to an input end of the first filter, and the third terminal is connected to an input end of the second filter, and
wherein the fourth terminal is connected to an output end of the first filter, the fifth terminal is connected to an output end of the second filter, and the sixth terminal is connected to the antenna connection terminal.
3. The radio frequency circuit according to claim 2, further comprising:
a first switch that has a first common terminal, a first selection terminal, and a second selection terminal, and that switches between connection between the first common terminal and the first selection terminal and connection between the first common terminal and the second selection terminal; and
a second switch that has a second common terminal, a third selection terminal, and a fourth selection terminal, and that switches between connection between the second common terminal and the third selection terminal and connection between the second common terminal and the fourth selection terminal,
wherein the first common terminal is connected to the output terminal of the power amplifier circuit, the first selection terminal is connected to the first terminal, and the second selection terminal is connected to an input end of the third filter, and
wherein the second common terminal is connected to the antenna connection terminal, the third selection terminal is connected to the sixth terminal, and the fourth selection terminal is connected to an output end of the third filter.
4. The radio frequency circuit according to claim 1, further comprising:
a first switch that has a first common terminal, a first selection terminal, and a second selection terminal, and that switches between connection between the first common terminal and the first selection terminal and connection between the first common terminal and the second selection terminal;
a second switch that has a second common terminal, a third selection terminal, and a fourth selection terminal, and that switches between connection between the second common terminal and the third selection terminal and connection between the second common terminal and the fourth selection terminal; and
a combiner circuit that has a fourth terminal, a fifth terminal, and a sixth terminal, and that combines signals, which are input at the fourth terminal and the fifth terminal, for output from the sixth terminal,
wherein the power amplifier circuit has
a first amplifier that supports Power class 2, and
a second amplifier that supports Power class 3,
wherein an output terminal of the first amplifier is connected to the first common terminal,
wherein an output terminal of the second amplifier is connected to an input end of the second filter,
wherein the first selection terminal is connected to an input end of the first filter, and the second selection terminal is connected to an input end of the third filter, wherein the fourth terminal is connected to an output end
of the first filter, the fifth terminal is connected to an
output end of the second filter, and the sixth terminal is
connected to the third selection terminal, and
wherein the second common terminal is connected to the
antenna connection terminal, and the fourth selection
terminal is connected to an output end of the third filter.
5. The radio frequency circuit according to claim 1,
wherein the antenna connection terminal comprises a first
antenna connection terminal and a second antenna
connection terminal,
wherein the radio frequency circuit comprises
a first switch that has a first common terminal, a first
selection terminal, and a second selection terminal,
and that switches between connection between the
first common terminal and the first selection terminal
and connection between the first common terminal
and the second selection terminal, and
a third switch that has a third common terminal, a
fourth common terminal, a fifth selection terminal, a
sixth selection terminal, and a seventh selection
terminal, that switches between connection and non-
connection between the fourth common terminal and
the sixth selection terminal, and that switches
between connection between the third common ter-
minal and the fifth selection terminal and connection
between the third common terminal and the seventh
selection terminal,
wherein the power amplifier circuit has
a first amplifier that supports Power class 2, and
a second amplifier that supports Power class 3,
wherein an output terminal of the first amplifier is con-
nected to the first common terminal,
wherein an output terminal of the second amplifier is
connected to an input end of the second filter,
wherein the first selection terminal is connected to an
input end of the first filter, and the second selection
terminal is connected to an input end of the third filter,
and
wherein the third common terminal is connected to the
first antenna connection terminal, the fourth common
terminal is connected to the second antenna connection
terminal, the fifth selection terminal is connected to an
output end of the first filter, the sixth selection terminal
is connected to an output end of the second filter, and
the seventh selection terminal is connected to an output
end of the third filter.
6. The radio frequency circuit according to claim 5,
further comprising:
a first substrate and a second substrate,
wherein the first amplifier, the first switch, the third
switch, the first filter, and the third filter are disposed
on/in the first substrate, and
wherein the second amplifier and the second filter are
disposed on/in the second substrate.
7. The radio frequency circuit according to claim 1,
further comprising:
a first substrate and a second substrate;
a first switch that has a first common terminal, a first
selection terminal, and a second selection terminal, and
that switches between connection between the first
common terminal and the first selection terminal and
connection between the first common terminal and the
second selection terminal; and
a second switch that has a second common terminal, a
third selection terminal, and a fourth selection terminal,
and that switches between connection between the second common terminal and the third selection termi-
nal and connection between the second common ter-
minal and the fourth selection terminal,
wherein the power amplifier circuit has
a first amplifier that supports Power class 2, and
a second amplifier that supports Power class 3,
wherein an output terminal of the first amplifier is con-
nected to the first common terminal,
wherein an output terminal of the second amplifier is
connected to an input end of the second filter,
wherein the first selection terminal is connected to an
input end of the first filter, and the second selection
terminal is connected to an input end of the third filter,
wherein the second common terminal is connected to the
antenna connection terminal, the third selection termi-
nal is connected to an output end of the first filter, and
the fourth selection terminal is connected to an output
end of the third filter,
wherein the first amplifier, the first switch, the second
switch, the first filter, and the third filter are disposed
on/in the first substrate, and
wherein the second amplifier and the second filter are
disposed on/in the second substrate.
8. The radio frequency circuit according to claim 6,
further comprising:
a fourth filter that has a passband including a downlink
operating band of the first band,
wherein an input end of the fourth filter is connected to an
output end of the first filter, and
wherein the fourth filter is disposed on/in the first sub-
strate.
9. The radio frequency circuit according to claim 6,
further comprising:
a fifth filter that has a passband including a downlink
operating band for frequency division duplex; and
a low-noise amplifier that is connected to an output end of
the fifth filter,
wherein the fifth filter and the low-noise amplifier are
disposed on/in the second substrate.
10. A radio frequency circuit comprising:
a first substrate;
a first antenna connection terminal and a second antenna
connection terminal;
a first amplifier that supports Power class 2;
a first filter that is connected between the first amplifier
and the first antenna connection terminal, that supports
Power class 3, and that has a passband including an
uplink operating band of a first band for frequency
division duplex;
a third filter that is connected between the first amplifier
and the first antenna connection terminal, that supports
Power class 2, and that has a passband including a
second band for time division duplex;
a first switch that has a first common terminal, a first
selection terminal, and a second selection terminal, and
that switches between connection between the first
common terminal and the first selection terminal and
connection between the first common terminal and the
second selection terminal; and
a third switch that has a third common terminal, a fourth
common terminal, a fifth selection terminal, a sixth
selection terminal, and a seventh selection terminal,
that switches between connection and non-connection
between the fourth common terminal and the sixth
selection terminal, and that switches between connec-
tion between the third common terminal and the fifth selection terminal and connection between the third common terminal and the seventh selection terminal, wherein an output terminal of the first amplifier is connected to the first common terminal, wherein the first selection terminal is connected to an input end of the first filter, and the second selection terminal is connected to an input end of the third filter, wherein the third common terminal is connected to the first antenna connection terminal, the fourth common terminal is connected to the second antenna connection terminal, the fifth selection terminal is connected to an output end of the first filter, and the seventh selection terminal is connected to an output end of the third filter, wherein the first amplifier, the first switch, the third switch, the first filter, and the third filter are disposed on/in the first substrate, wherein, in the case of output of a transmit signal in the first band, which supports Power class 2, assuming a transmit signal in the uplink operating band of the first band, which supports Power class 3, is being input at the sixth selection terminal from a second amplifier different from the first amplifier, a transmit signal in the uplink operating band of the first band, which supports Power class 3, is output from the first amplifier to the first filter, and wherein, in the case of output of a transmit signal in the second band, which supports Power class 2, a transmit signal in the second band is output from the first amplifier to the third filter.

11. A communication device comprising:

a signal processing circuit that processes a radio frequency signal; and the radio frequency circuit according to claim 1 that transmits the radio frequency signal between the signal processing circuit and an antenna.

* * * * *